United States Patent
Yilmaz (10) Patent No.: US 9,024,645 B2
(45) Date of Patent: May 5, 2015

(54) SUBSTANTIALLY EDGELESS TOUCH SENSOR

(75) Inventor: Esat Yilmaz, Santa Cruz, CA (US)

(73) Assignee: Atmel Corporation, San Jose, CA (US)

(*) Notice: Subject to any disclaimer, the term of this patent is extended or adjusted under 35 U.S.C. 154(b) by 386 days.

(21) Appl. No.: 13/312,369

(22) Filed: Dec. 6, 2011

(65) Prior Publication Data

US 2013/0141119 A1    Jun. 6, 2013

(51) Int. Cl.
| | | |
|---|---|---|
| *G01R 27/26* | (2006.01) | |
| *G06F 3/041* | (2006.01) | |
| *G06F 3/044* | (2006.01) | |
| *H03K 17/96* | (2006.01) | |

(52) U.S. Cl.
CPC .......... *H03K 17/9622* (2013.01); *G06F 3/0416* (2013.01); *G06F 3/044* (2013.01); *G06F 2203/04112* (2013.01)

(58) Field of Classification Search
CPC .......... G02F 1/13338; H03K 17/9602; G01R 27/2605; H04M 2240/22
USPC ................................................. 324/358–690
See application file for complete search history.

(56) References Cited

U.S. PATENT DOCUMENTS

| | | | |
|---|---|---|---|
| 7,663,607 B2 | 2/2010 | Hotelling | |
| 7,755,616 B2 * | 7/2010 | Jung et al. ..................... | 345/174 |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 2001/0055004 A1* | 12/2001 | Gerpheide et al. ............ | 345/173 |
| 2008/0265914 A1* | 10/2008 | Matsushima ................ | 324/686 |
| 2009/0315854 A1 | 12/2009 | Matsuo | |
| 2010/0113952 A1* | 5/2010 | Raguin et al. ................. | 600/509 |
| 2010/0164889 A1* | 7/2010 | Hristov et al. ................ | 345/173 |
| 2011/0285412 A1* | 11/2011 | Ibuki et al. .................... | 324/686 |
| 2012/0162099 A1* | 6/2012 | Yoo et al. ..................... | 345/173 |
| 2012/0242588 A1 | 9/2012 | Myers | |
| 2012/0242592 A1 | 9/2012 | Rothkopf | |
| 2012/0243151 A1 | 9/2012 | Lynch | |
| 2012/0243719 A1 | 9/2012 | Franklin | |
| 2013/0016065 A1* | 1/2013 | Reynolds et al. ............. | 345/174 |
| 2013/0032414 A1* | 2/2013 | Yilmaz et al. .............. | 178/18.06 |

FOREIGN PATENT DOCUMENTS

WO    WO 2012/129247    9/2012

OTHER PUBLICATIONS

Kono, Touch Switch, PCT/JP2011/073891, Filed Oct. 18, 2011, Translated Sep. 18, 2013.*
U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

* cited by examiner

*Primary Examiner* — Huy Q Phan
*Assistant Examiner* — Dustin Dickinson
(74) *Attorney, Agent, or Firm* — Baker Botts LLP (57) ABSTRACT

In one embodiment, an apparatus is provided that includes a touch sensor. The touch sensor includes a plurality of drive electrodes made of conductive material, a plurality of sense electrodes made of conductive material, and a plurality of edges. Each of the drive electrodes and each of the sense electrodes are coupled to at least one track. The tracks are located along only one of the plurality of edges of the touch sensor.

12 Claims, 5 Drawing Sheets

SUBSTANTIALLY EDGELESS TOUCH SENSOR

TECHNICAL FIELD

This disclosure generally relates to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch sensitive display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

DESCRIPTION OF EXAMPLE EMBODIMENTS

Figure 1:
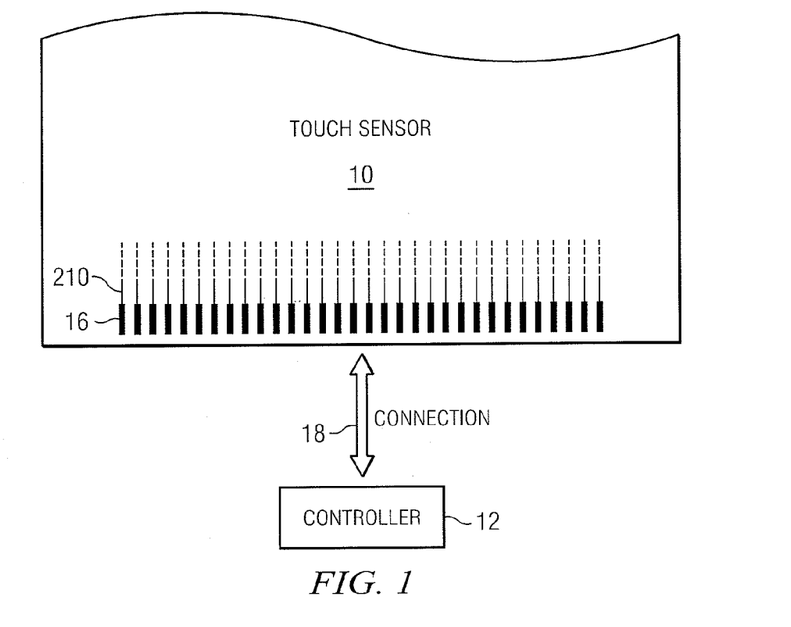
FIG. 1 illustrates an example touch sensor with an example touch-sensor controller.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a drive electrode or a sense electrode) may be an area of conductive material forming a shape, such as for example a disc, square, rectangle, thin line, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% (such as for example, approximately 5%) of the area of its shape. As an example and not by way of limitation, an electrode may be made of fine lines of metal or other conductive material (such as for example copper, silver, or a copper- or silver-based material) and the fine lines of conductive material may occupy substantially less than 100% (such as for example, approximately 5%) of the area of its shape in a hatched, mesh, or other suitable pattern. As another example and not by way of limitation, the fine lines of conductive material may occupy approximately 100% of the area of its shape (sometimes referred to as 100% fill), where appropriate. Although this disclosure describes or illustrates particular electrodes made of particular conductive material forming particular shapes with particular fill percentages having particular patterns, this disclosure contemplates any suitable electrodes made of any suitable conductive material forming any suitable shapes with any suitable fills having any suitable patterns. Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 µm or less and a width of approximately 10 µm or less. As another example, one or more portions of the conductive material may be silver or silver-based and similarly have a thickness of approximately 5 µm or less and a width of approximately 10 µm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. In particular embodiments, multiple touch-sensor controllers 12 are disposed on the FPC. In some embodiments, the FPC may have no touch-sensor controllers 12 disposed on it. The FPC may couple touch sensor 10 to a touch-sensor controller 12 located elsewhere, such as for example, on a printed circuit board of the device. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 210 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 210 to touch-sensor controller 12. Tracks 210 may extend into or around (e.g. at the edges of) the touch-sensitive area(s) of touch sensor 10. Particular tracks 210 may provide drive connections for coupling touch-sensor controller 12 to drive electrodes of touch sensor 10, through which the drive unit of touch-sensor controller 12 may supply drive signals to the drive electrodes. Other tracks 210 may provide sense connections for coupling touch-sensor controller 12 to sense electrodes of touch sensor 10, through which the sense unit of touch-sensor controller 12 may sense charge at the capacitive nodes of touch sensor 10. Tracks 210 may be made of fine lines of metal or other conductive material. As an example and not by way of limitation, the conductive material of tracks 210 may be copper or copper-based and have a width of approximately 100 µm or less. As another example, the conductive material of tracks 210 may be silver or silver-based and have a width of approximately 100 µm or less. In particular embodiments, tracks 210 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 210, touch sensor 10 may include one or more ground lines terminating at a ground connector (which may be a connection pad 16) at an edge of the substrate of touch sensor 10 (similar to tracks 210).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 210 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 210 and to the drive or sense electrodes of touch sensor 10. In another embodiment, connection pads 16 may be connected to an electro-mechanical connector (such as a zero insertion force wire-to-board connector); in this embodiment, connection 180 may not need to include an FPC. This disclosure contemplates any suitable connection 18 between touch-sensor controller 12 and touch sensor 10.

Figure 2:
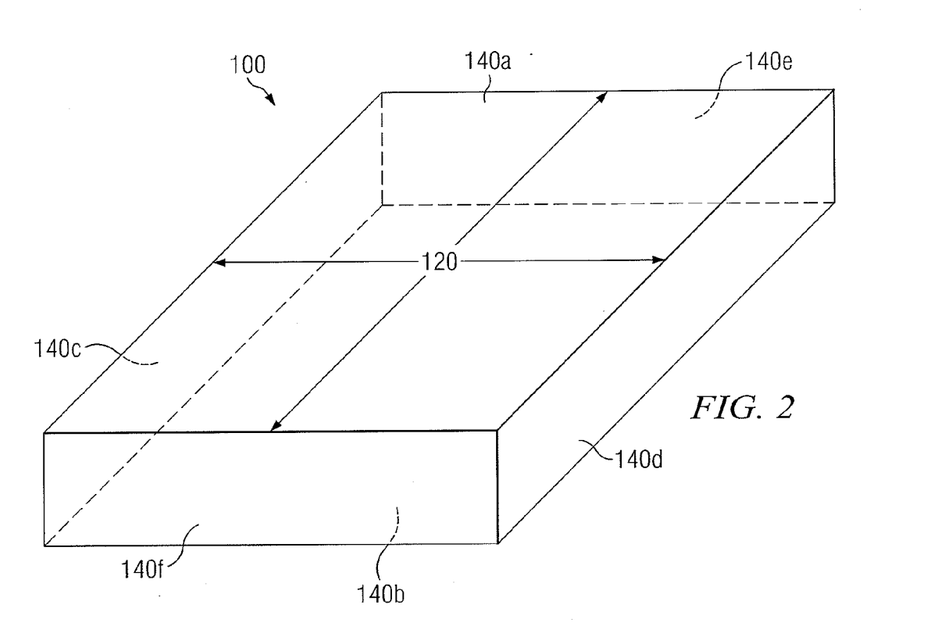
FIG. 2 illustrates an example device with a touch-sensitive area.

FIG. 2 illustrates an example device 100 with an example touch-sensitive area 120. Device 100 may be a smartphone, a PDA, a tablet computer, a laptop computer, a desktop computer, a kiosk computer, a satellite navigation device, a portable media player, a portable game console, a point-of-sale device, another suitable device 100, a suitable combination of two or more of these, or a suitable portion of one or more of these. Device 100 may have six surfaces 140: (1) front surface 140*a*; (2) back surface 140*b*; (3) left-side surface 140*c*; (4) right-side surface 140*d*; (5) top surface 140*e*; and (6) bottom surface 140*f*. Although this disclosure describes and illustrates a particular device with a particular number of particular surfaces with particular shapes and sizes, this disclosure contemplates any suitable device with any suitable number of any suitable surfaces with any suitable shapes (including but not limited to being planar in whole or in part, curved in whole or in part, flexible in whole or in part, or a suitable combination of these) and any suitable sizes.

Device 100 may have a touch-sensitive area 120 on front surface 140*a*. Touch-sensitive area 120 may detect the presence and location of a touch or the proximity of an object (for example a user's finger or a stylus) within touch-sensitive area 120. Touch-sensitive area 120 may extend out to one or more of the edges of surface 140*a*. In the example of FIG. 2, touch-sensitive area 120 on front surface 140*a* extends substantially out to all four edges of front surface 140*a*. Surface 140*a* may include room along one or more of its edges for tracking, as described below. Although this disclosure describes and illustrates a particular touch-sensitive area with a particular shape and size on a particular surface of a particular device, this disclosure contemplates any suitable number of any suitable touch-sensitive areas with any suitable shapes and sizes on any suitable number of any suitable surfaces of any suitable device.

Figure 3A:
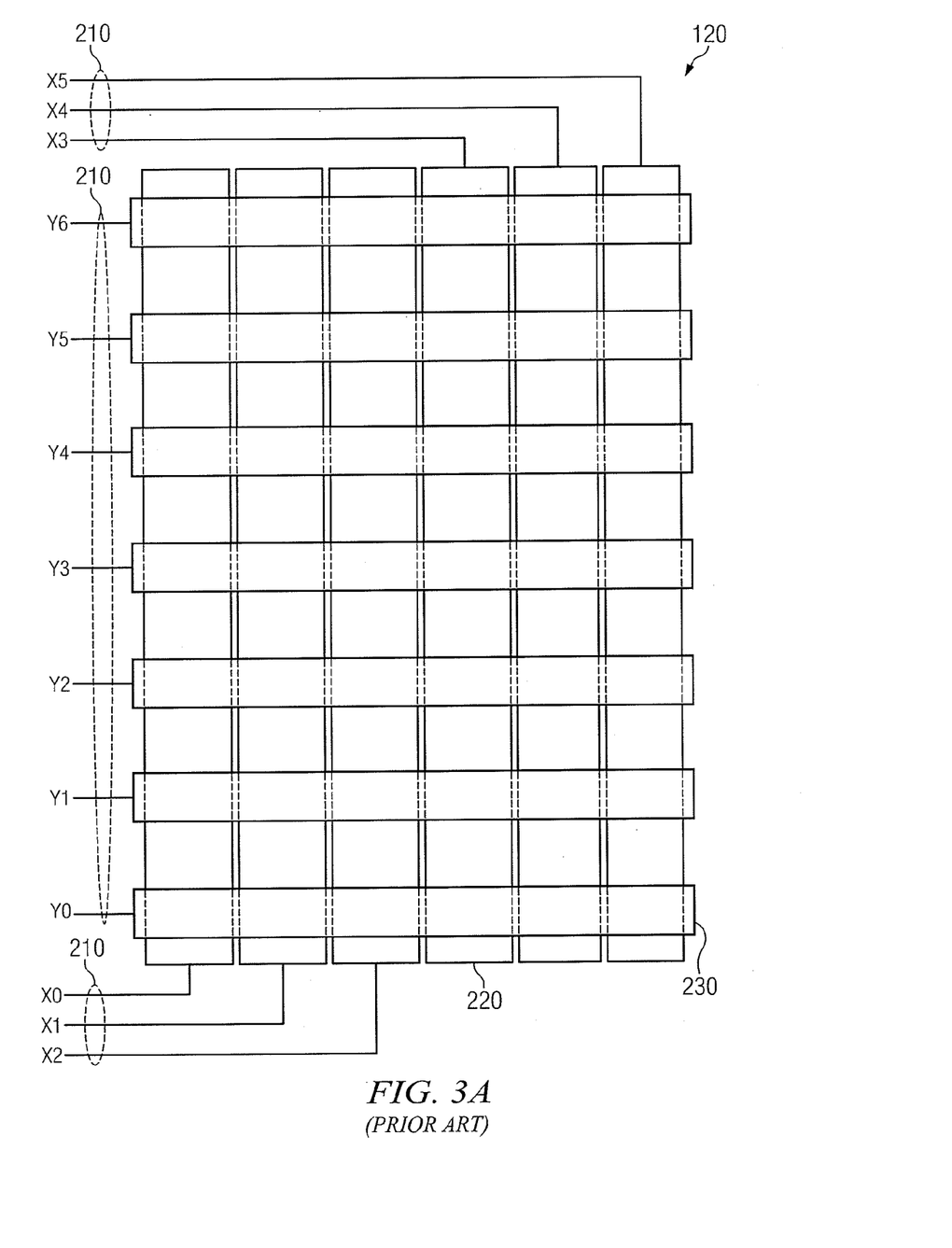
FIG. 3A illustrates an example prior-art design for a touch sensor.
Figure 3B:
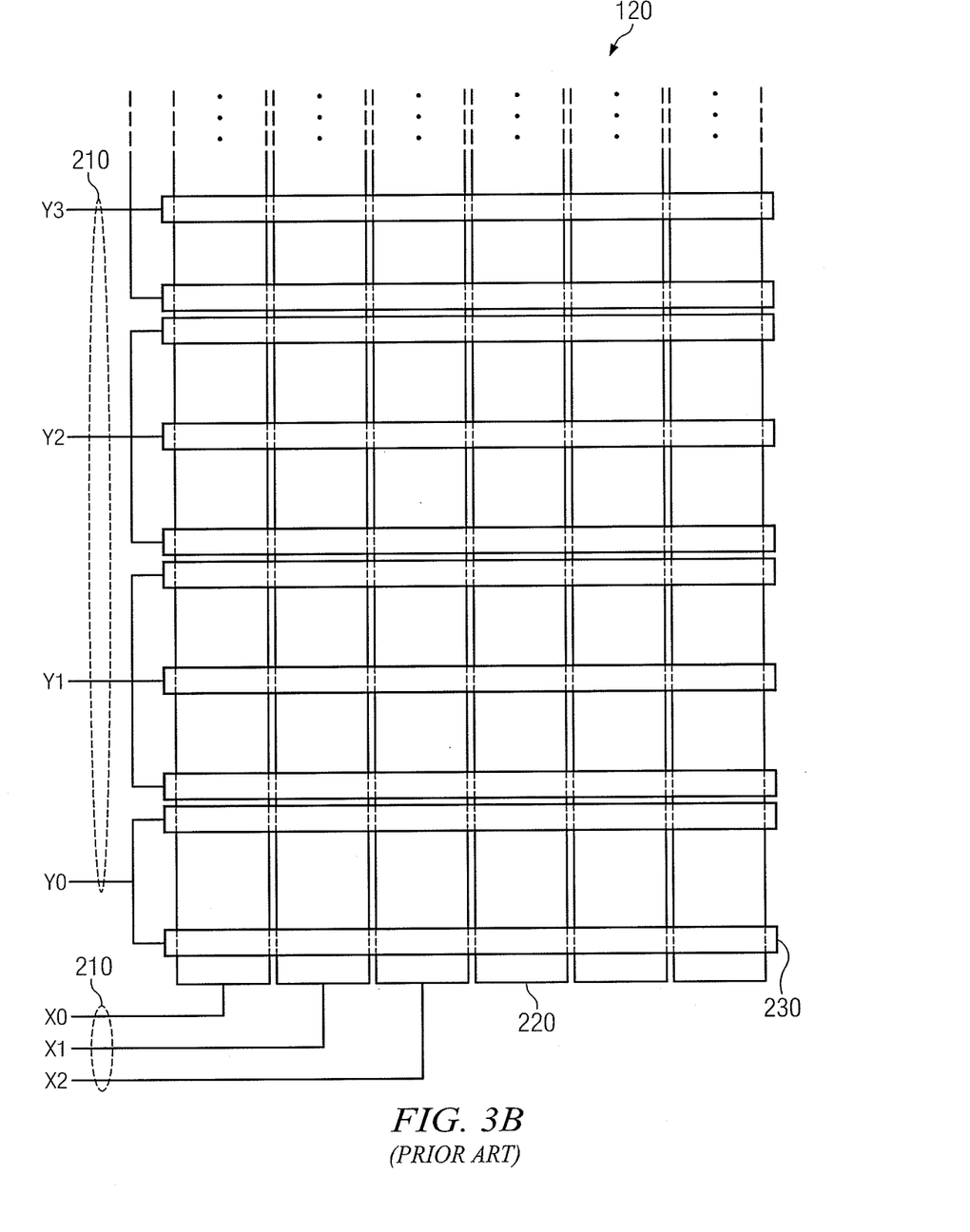
FIG. 3B illustrates another example prior-art design for a touch sensor.

FIGS. 3A and 3B illustrate non-limiting examples of prior-art designs for example touch sensors 10. In general, drive electrodes 220 and sense electrodes 230 have tracks 210 that are located along multiple edges of touch sensitive area 120. Tracks 210 for the sense electrodes are located along a first edge, while tracks 210 for drive electrodes are located along a second and a third edge. These prior-art designs will be discussed further with respect to FIGS. 3A and 3B.

FIG. 3A illustrates a prior-art design for a touch sensor. In the example of FIG. 3A, the touch sensor includes a touch sensitive area 120 that includes an array of drive electrodes 220 and sense electrodes 230. The drive electrodes 220 and sense electrodes 230 are arranged in a two-layer configuration. Drive electrodes 220 and sense electrodes 230 sense the presence and location of a touch or the proximity of an object within touch sensitive area 120.

Touch sensor 10 includes tracks 210 that are located along the edges of touch sensitive area 120. Tracks 210 couple the drive electrodes 220 and the sense electrodes 230 to the connection pads 16 on the FPC, in turn connecting them to touch-sensor controller 12. Tracks 210 are located along multiple edges of touch sensitive area 120. In the example of FIG. 3A, tracks 210 of sense electrodes 230 are located along the left edge of touch sensitive area 120. Tracks 210 for drive electrodes 220 are split such that half of the tracks 210 are located along the bottom edge of touch sensitive area 120 and the other half are located along the top edge of touch sensitive area 120. In this manner, tracks 210 couple the drive electrodes 220 and the sense electrodes 230 to an FPC located near the left edge of touch sensitive area 120. The presence of tracks 210 prevent the drive electrodes 220 and the sense electrodes 230 from being extended towards certain edges of touch sensitive area 120. For example, the X3, X4, and X5 tracks 210 that are located along the top edge of touch sensitive area 120 prevent the drive electrodes 220 from being extended towards the top edge of touch sensitive area 120.

FIG. 3B illustrates another prior-art design for a touch sensor 10. In the example of FIG. 3B, drive electrodes 220 and sense electrodes 230 are arranged in a two-layer configuration. Drive electrodes 220 are arranged similar to drive electrodes 220 in FIG. 3A. Sense electrodes 230 are arranged in a trident configuration, where a particular sense electrode 210 is split into three prongs. The prongs share a track 210. Although this disclosure describes a sense electrode being split into a particular number of prongs, this disclosure contemplates the sense electrodes being split into any suitable number of prongs. As in FIG. 3A, tracks 210 are located along certain edges of touch sensitive area 120. For example, tracks 210 for sense electrodes 230 are located along the left edge of touch sensitive area 120. The presence of tracks 210 prevent drive electrodes 220 and sense electrodes 230 from being extended to certain edges of touch sensitive area 120. For example, the X0, X1, and X2 tracks 210 that are located along the bottom edge of touch sensitive area 120 prevent the drive electrodes 220 from being extended towards the bottom edge of touch sensitive area 120.

Figure 4:
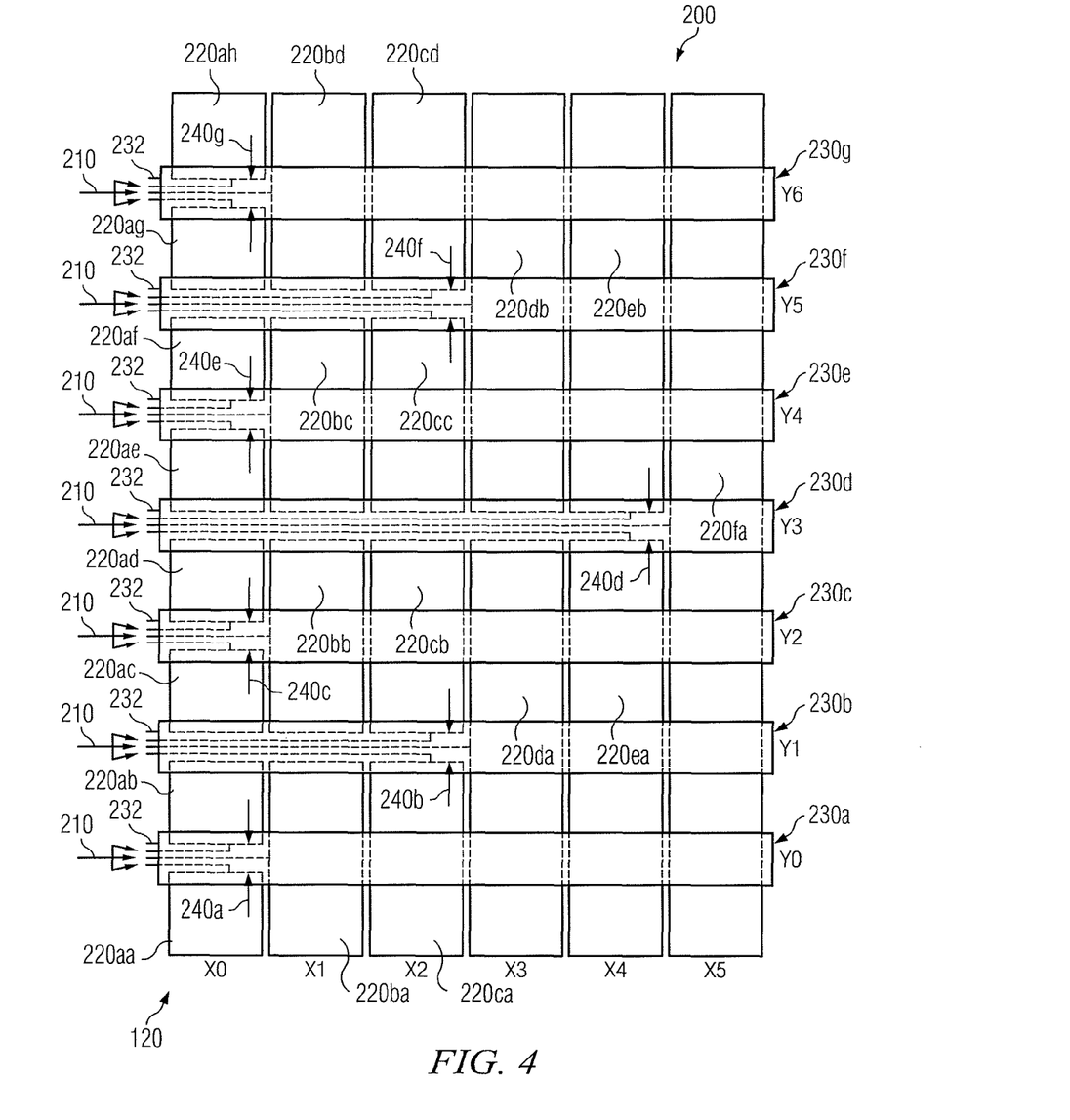
FIG. 4 illustrates an example design for an example touch sensor that is substantially edgeless.

FIG. 4 illustrates an example design for an example touch sensor 200 that is substantially edgeless. In general, drive and sense electrodes may be arranged to allow for tracks 210 to be located along only one edge of touch sensitive area 120. In this manner, space may be freed up along the other edges of touch sensitive area 120, and the drive and sense electrodes may be extended closer towards those edges of touch sensor 200. As a result, touch sensor 200 may be substantially edgeless because one or more edges of touch sensitive area 120 are extended substantially close to or up against one or more the edges of touch sensor 200. Furthermore, the edge of touch sensor 200 that contains the tracks 210 may be bent around the edge of the device containing the touch sensor, such that the corresponding edge of touch sensitive area 120 may be extended substantially close to the edge of the device, such that the touch sensitive area extends substantially to all of the edges of the device.

In the example of FIG. 4, drive electrodes 220 and sense electrodes 230 are arranged to allow tracks 210 to be located along one edge of touch sensitive area 120. As an example and not by way of limitation, drive electrodes 220 are arranged to allow tracks 210 for drive electrodes 220 to be located along the same edge as tracks 232 for sense electrodes 230. In this example arrangement, the tracks for all of the electrodes are located along only the left-hand edge of touch sensitive area 120. In this example arrangement, various drive electrodes 220 define channels 240. In the illustrated embodiment, each channel 240 contains a coupling spine that couples three drive electrodes to coupling pads 160. For example, channel 240*d* contains a coupling spine, consisting of three tracks 210 that couples drive electrodes 220*ea*, 220*eb*, and 220*fa* to coupling pads 16.

Channel 240*d* separates each of what would be otherwise be full-length (from the bottom to the top of the sensing area) drive electrode columns X0-X4 into smaller drive electrodes. While channel 240 contains a coupling spine that couples the separated sections of drive electrode column X4 (drive electrodes 220*ea* and 220*eb*) to coupling pads 16, that coupling spine does not include tracks that couple the separated sections of drive electrode columns X0-X3 to the coupling pads 16. For example, the separated sections of column X2 (drive electrodes 220*ca*, 220*cb*, 220*cc*, and 220*cd*) and X3 (drive electrodes 220*da* and 220*db*) are not coupled to the coupling spine in channel 240*d*. To resolve this lack of coupling, two additional channels 240*b* and 240*f* are provided, to accommodate coupling spines to couple the drive electrodes of columns X2 and X3 to the coupling pads. As an example and not by way of limitation, channel 240*b* contains a coupling spine that couples drive electrodes 220*ca* and 220*cb* of column X2, and drive electrode 220*da* of column X3, to the coupling pads. As another example and not by way of limitation, channel 240*f* contains a coupling spine that couples drive electrodes 220*cc* and 220*cd* of column X2, and drive electrode 220*db* of column X3, to the coupling pads.

In particular embodiments, drive electrode columns X0-X5 are first each formed as one full-length electrode and then cuts are made into the columns, forming channels 240 and the various drive electrodes separated by those channels. In some embodiments, the various drive electrodes 220 are formed as multiple pieces. These pieces are then arranged in a particular manner to form channels 240.

In the example of FIG. 4, each sense electrode 230 corresponds to a channel 240. This arrangement allows for channels 240 to each contain fewer tracks 210 than an example in which there are fewer channels 240. Moreover, each sense electrode 230 overlays its corresponding channel 240.

In particular embodiments, by using channels 240 of various lengths in various portions of touch sensitive area 120, tracks 210 can be located along one edge of touch sensitive area 120 rather than multiple edges of touch sensitive area 120. Thus, drive electrodes 220 and sense electrodes 230 can extend substantially all the way to the edges of touch sensor 200, except for the edge along with the tracks are located, such that touch sensor 200 is substantially edgeless. In particular embodiments, the material of the tracks 210 is flexible, so that the area of touch sensor 200 associated with the edge containing the tracks 210, can be folded over an edge of a device using the touch sensor. In this manner, the touch sensitive area 120 of touch sensor 200 is substantially edgeless in relation to the surface area of the device, even though parts of touch sensor 200 that contain electrodes is not folded over any edge of the device.

Figure 5:
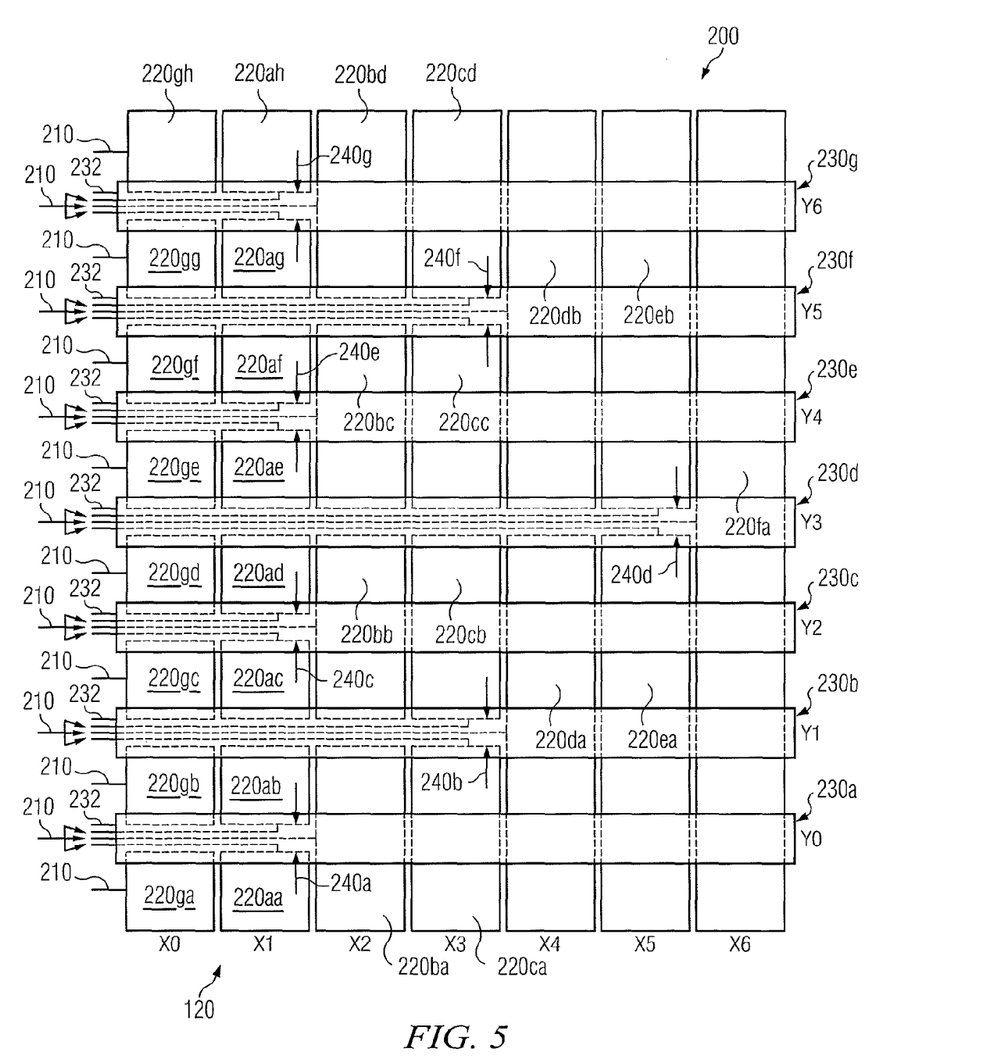
FIG. 5 illustrates another example design for an example touch sensor that is substantially edgeless.

FIG. 5 illustrates another example design for an example touch sensor 200 that is substantially edgeless. As provided in FIG. 5, touch sensor 200 has more drive electrode columns than the example design of FIG. 4. Each section 220*ga-gh* of the drive electrode column X0, which is the drive electrode column adjacent the edge of the sensor that contains tracks 210, is coupled to a track 210 that couples the section to a corresponding connection pad 16. Unlike the tracks 210 for drive electrode columns X1-X6, these tracks 210 do not occupy a channel 240. Having some of the tracks 210 outside of a channel 240 reduces the number of tracks 210 per channel 240. Fewer tracks 210 per channel 240 allows narrower channels 240, which improves sensing performance. Furthermore, fewer tracks 210 per channel 240 allows wider tracks 210, which improves the performance of tracks 210 by reducing the impedance of each track 210.

In some embodiments, the number of tracks 210 per channel 240 is further reduced by routing a small number of tracks 210 for drive electrodes 220 through the top or bottom edge of touch sensor 200. Tracks 210 are routed through the top or bottom edge via channels 240 or direct coupling to drive electrodes 220 (such as for example, the drive electrodes 220 that are along the edges of touch sensor 200). Although tracks 210 are located along the top or bottom edge of touch sensor 200, touch sensor 200 still extends substantially close to the edge of the device because of the small number of tracks 210 located along the top or bottom edge of touch sensor 200. As an example and not by way of limitation, channel 240d of example touch sensor 200 of FIG. 5 can be narrowed to accommodate fewer tracks 210 if the track 210 for drive electrode column X6 was located along the bottom edge of touch sensor 200. Touch sensor 200 still extends substantially close to the edge of the device despite the presence of track 210 at the bottom edge of touch sensor 200.

Although this disclosure describes sense electrodes 210, drive electrodes 220, and channels 240 arranged in a particular manner within touch sensitive area 120, this disclosure contemplates sense electrodes 210, drive electrodes 220, and channels 240 arranged in any suitable manner within touch sensitive area 120. As an example and not by way of limitation, sense electrodes 210 may be arranged horizontally and drive electrodes 220 may be arranged vertically, as in the example of FIG. 4, or vice versa.

Although the illustrated embodiment shows a particular number and arrangement of channels 240 each containing a particular number and arrangement of tracks 210, this disclosure contemplates any suitable number and arrangement of channels 240 each containing any suitable number of tracks 210 in any suitable arrangement. Although this disclosure describes channels 240 being formed in particular manners, this disclosure contemplates channels 240 being formed in any suitable manner.

Although this disclosure describes particular channels containing tracks that couple particular sections of drive electrodes 220 to the FPC, this disclosure contemplates any suitable channels containing tracks that couple any suitable sections of drive electrodes 220 to the FPC. In particular embodiments, this process of forming additional channels 240 to allow for tracks 210 to couple sections of drive electrodes 220 to the FPC is carried out iteratively to couple each section of each drive electrode 220 to the FPC. In particular embodiments, each channel 240 lies beneath sense electrodes 230. In this manner, each channel 240 corresponds to a particular sense electrode 230. Although this disclosure describes forming channels 240 in particular locations, this disclosure contemplates forming channels 240 in any suitable location.

Although this disclosure describes a touch sensitive area 120 that includes a particular number of drive electrodes 220 and a particular number of sense electrodes 230, this disclosure contemplates a touch sensitive area 120 with any suitable number of drive electrodes 220 and sense electrodes 230. Although this disclosure describes channels 240 of particular lengths formed into particular portions of touch sensitive area 120, this disclosure contemplates channels 240 of any suitable length formed into any suitable portions of touch sensitive area 120. Although this disclosure describes forming channels 240 using particular processes, this disclosure contemplates forming channels 240 using any suitable process. Although this disclosure describes touch sensor 200 being substantially edgeless despite a particular number of tracks 210 located along more than one edge of touch sensor 200, this disclosure contemplates touch sensor 200 being substantially edgeless despite any suitable number of tracks 210 located along more than one edge of touch sensor 200.

Herein, reference to a computer-readable storage medium encompasses one or more non-transitory, tangible computer-readable storage media possessing structure. As an example and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a secure digital card, a secure digital drive, or another suitable computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An apparatus comprising:
   a touch sensor having a touch sensitive area, the touch sensor comprising a plurality of drive electrodes made of conductive material, a plurality of sense electrodes made of conductive material, and a plurality of edges;
   each of the drive electrodes and each of the sense electrodes being coupled to at least one track, the tracks located along only one of a plurality the plurality of edges of the touch sensitive area of the touch sensor; and
   a channel defined by at least one drive electrode and lying entirely underneath one of the sense electrodes, a portion of the channel being occupied by at least one of the tracks.

2. The apparatus of claim 1, wherein a portion of the channel is occupied by three tracks.

3. The apparatus of claim 1, wherein the channel is defined by at least two drive electrodes of substantially equivalent lengths.

4. The apparatus of claim 1, wherein the touch sensor further comprises a substrate, and the substrate is folded at the edge of the touch sensor that the tracks are located along to accommodate a form factor of a device comprising the touch sensor.

5. The apparatus of claim 4, the plurality of drive electrodes and the plurality of sense electrodes being arranged on the substrate such that the tracks are located along only one edge of the touch sensor.

6. The apparatus of claim 1, wherein the plurality of drive electrodes and the plurality of sense electrodes extend substantially to all of the edges of the touch sensor, except for the edge along which the tracks are located.

7. An apparatus comprising:
a touch sensor having a touch sensitive area, the touch sensor comprising a plurality of drive electrodes made of conductive material, a plurality of sense electrodes made of conductive material, and a plurality of edges;
each of the drive electrodes and each of the sense electrodes being coupled to at least one track, the majority of the tracks located along one of a plurality the plurality of edges of the touch sensitive area such that the touch sensitive area of the touch sensor extends substantially close to one or more edges of the touch sensor; and
a channel defined by at least one drive electrode and lying entirely underneath one of the sense electrodes, a portion of the channel being occupied by at least one of the tracks.

8. The apparatus of claim 7, wherein a portion of the channel is occupied by three tracks.

9. The apparatus of claim 7, wherein the channel is defined by at least two drive electrodes of substantially equivalent lengths.

10. The apparatus of claim 7, wherein the touch sensor further comprises a substrate, and the substrate is folded at the edge of the touch sensor that the tracks are located along to accommodate a form factor of a device comprising the touch sensor.

11. The apparatus of claim 10, the plurality of drive electrodes and the plurality of sense electrodes being arranged on the substrate such that the majority of the tracks are located along one edge of the touch sensor.

12. The apparatus of claim 7, wherein the plurality of drive electrodes and the plurality of sense electrodes extend substantially to all of the edges of the touch sensor, except for the edge along which the tracks are located.

* * * * *